United States Patent [19]

Gandhi et al.

[11] 3,833,858

[45] Sept. 3, 1974

[54] HIGH GAIN SOLID-STATE DISTRIBUTED INTERACTION MICROWAVE AMPLIFIER

[75] Inventors: O. P. Gandhi; L. S. Metz, both of Salt Lake City, Utah

[73] Assignee: University of Utah, Salt Lake City, Utah

[22] Filed: June 15, 1973

[21] Appl. No.: 370,370

[52] U.S. Cl. .................... 330/5, 330/53

[51] Int. Cl. .................... H03f 3/04

[58] Field of Search .................... 330/5

[56] References Cited

UNITED STATES PATENTS 3,754,191 8/1973 Acket et al. .................... 330/5

*Primary Examiner*—Herman Karl Saalbach
*Assistant Examiner*—Darwin R. Hostetter

[57] ABSTRACT

Traveling-wave amplification of microwave energy having frequencies up to 500 GHz is provided by a semiconductor (GaAs, GaP, InAs, InP) which has a thin epitaxial layer capable of exhibiting the property of negative differential conductivity. A thin resistive layer is applied on the skin of the epitaxial layer to smooth out the dc electric field profile and allow use of longer layers with a selective control of band pass and gain properties of the amplifier.

11 Claims, 4 Drawing Figures

| | 1 | 2 |
|---|---|---|
| $n_0$ | $4 \times 10^{14}$ / $cm^3$ | $10^{14}$ / $cm^3$ |
| T | 4 μ | 8 μ |
| $E_0$ | 4.5 kV/cm | 4.0 kV/cm |
| $E_{II}/E_I$ | .3 | .3 |
| $r_0/r_s$ | .400 | .367 |
| D | 589 $cm^2$/sec | 680 $cm^2$/sec |

| $n_0 = 10^{14}$ T = 8 μ FOR 1 THROUGH 4 | | | | | $n_0 = 4 \times 10^{14}$ T = 4 μ FOR 5 THROUGH 8 | | | | |
|---|---|---|---|---|---|---|---|---|---|
| | $r_0/r_s$ | $E_0$ (kV/cm) | $E_{II}/E_I$ | D $cm^2/sec$ | | $r_0/r_s$ | $E_0$ (kV/cm) | $E_{II}/E_I$ | D $cm^2/sec$ |
| 1 | .367 | 5. | .3 | 589 | 5 | .4 | 5. | .3 | 589 |
| 2 | .367 | 4. | .3 | 780 | 6 | .4 | 4.5 | .3 | 680 |
| 3 | .500 | 5. | .3 | 589 | 7 | .4 | 4. | .3 | 780 |
| 4 | .367 | 5. | .3 | 589 | 8 | .5 | 5. | .3 | 589 |

HIGH GAIN SOLID-STATE DISTRIBUTED INTERACTION MICROWAVE AMPLIFIER

This invention relates to an amplifier device and method for amplifying microwave energy having frequencies up to several GHz.

Traveling-wave amplification from bars of GaAs typically 1 mm long and 0.75 mm square cross section having an epitaxial layer with a doping density $n_o$ of about $10^{12}$ cm$^{-3}$. The amplification results from a near synchronous propagation (phase velocity $v_p$ on the order of the electron drift velocity $v_o$ typically of about $1.4 \times 10^7$ cm/s) of waves through the medium GaAs, which is biased into the negative mobility region. Terminal gains of 2–4 dB were observed for frequencies of about 1GHz. This type of amplification is superior to the negative-conductance reflection amplification in that it is a two-port nonreciprocal device with separate input and output terminals.

Some of the best results reported so far are $13 \pm 4$ instantaneous net gain in the 1.7–4.0 GHz band and $6 \pm 4$ dB gain in the 6 to 15 GHz band. Stabilization against domain formation leading to oscillations is obtained in each case by using material doping ($n_o$) and thickness ($d$) product less than about $2 \times 10^{11}$ cm$^{-2}$. For one particular prior art amplifier, the pertinent specifications are: $n_o = 6 \times 10^{12}$ cm$^{-3}$, $d = 200\ \mu$, length L in the direction of amplification $= 300\ \mu$, and width W of the sample $= 650\mu$. For another traveling-wave amplifier reported recently, a thin epitaxial film $d = 2\ \mu$ of $n$-GaAs, $n_o \approx 2 \times 10^{15}$ cm$^{-3}$ grown on a semiinsulating GaAs substrate was used with length L on the order of 50–70 $\mu$ and width W of about $500\mu$.

These thin film amplifiers allow the use of integrated circuit techniques for their fabrication. Furthermore, since the doping density $n_o$ is high enough, the material exhibits a positive temperature coefficient of resistivity as against the hithertofore used compensated materials ($n_o \lesssim 10^{12}$ cm$^{-3}$) which resulted in their exhibiting negative temperature coefficients of resistivity. This has permitted dc biasing, and hence, CW operation of the thin film amplifier unlike the bulk grown GaAs amplifiers which had to be pulsed to reduce heating of the material.

Two major disadvantages of the prior GaAs amplifier are the interaction length L of 50 to $70\mu$ is so small that there is a passive 20–30 dB down inductive feedback because of the rather close vicinity of output to input terminals. This results in an undulatory behavior of the observed gain with maxima observed at frequency intervals of about 2–2.5 GHz, consistent with the condition that positive feedback results for frequencies separated $V_o/L$ apart. Because of a larger $L = 300\mu$, the frequencies for maximum observed gain are 435 MHz apart in the bulk GaAs amplifier in one of the prior art devices.

A secondary disadvantage is that the transducers, one at each end, have consisted of two metallic strips with a separation of $17\mu$ between the strips. The coupling of the slow space-charge waves occurs through the RF fields between the strips, and is at best quite poor with each transducer contributing a 15 to 25 dB coupling loss.

It is an object of the present invention to provide a novel integrated traveling microwave amplifier and method that obviates the difficulties mentioned above.

A further object is to provide a novel resistive layer on the upper epitaxial layer, as by ion bombardment of the epitaxial layer skin, to allow a dc field to be established. This field may be so arranged to make the differential conductivity positive for lower frequencies which therefore curtails the amplification at unwanted frequencies. With the dc biasing problem eliminated, longer device lengths can be used which provide increased isolation between input and output terminals and thus provide more stable amplification.

Still another object is to provide a novel integrated traveling microwave amplifier where the resistive layer between the input and output transducers is covered by a layer of high permittivity material. Such a layer helps to reduce the RF growth constant without contributing to the drain on the current from the dc voltage supply.

These and other objects of the invention will become more fully apparent from the claims, and from the description as it proceeds in conjunction with the drawings wherein:

Figure 1:
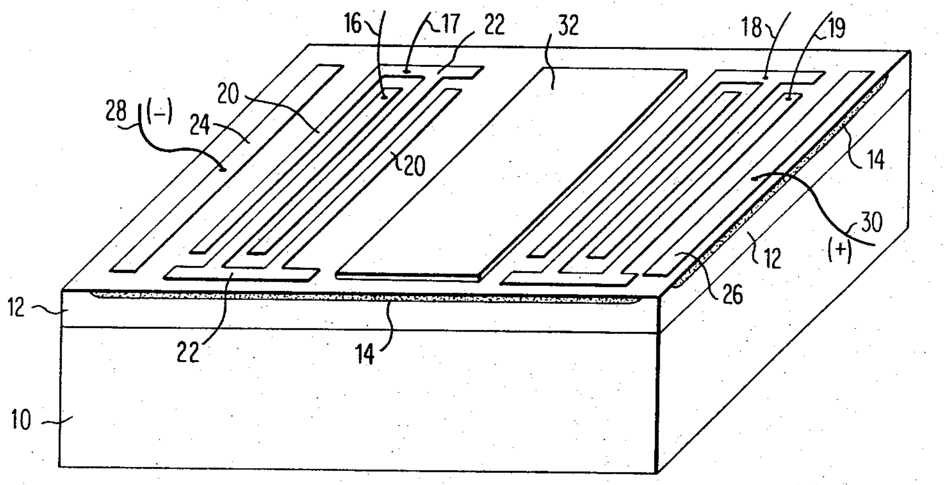
FIG. 1 is a pictorial drawing of an integrated traveling microwave amplifier in accordance with the present invention.

Referring now to the drawing, a substrate 10 of a suitable semiconductor material is provided in accordance with conventional procedures. An epitaxial layer 12 having a thickness of between about 3 and 10 microns is provided also in accordance with prior art procedures. The epitaxial material to be used is that which exhibits the property of negative differential conductivity. Negative conductivity occurs when the electric current reduces rather than increases as the electric field is increased. This property has been demonstrated to exist in gallium arsenide, gallium phosphide, indium arsenide, and indium phosphide. Regardless of the material of the semiconductor or the phenomenon responsible for the negative conductive property, once this property is demonstrated to exist the semiconductor may e used in accordance with the present invention.

On the upper surface of epitaxial layer 12, a thin resistive layer 14 is provided which may have a thickness less than one micron. This resistive layer 14 may be obtained by either of several available means, some of them being by sputtering on the material, by vapor deposition or by "spoiling" the skin of the epitaxial layer 12 as by ion implementation.

The electromagnetic energy may be coupled into and out of the device by terminals 16, 17 and 18, 19 connected to a suitable waveguide such as a microstrip transmission line. The input transducer may consist of interleaved strips 20 of conductive material deposited on the upper surface of the epitaxial layer 12. Alternate strips 20 are connected by end bars 22 forming a so-called interdigital transducer. The output transducer connected to output terminals 18 and 19 may be identical to the input transducer.

On the outside edges of the input and output transducers are a pair of ohmic contact strips 24 and 26. To each of these strips, a terminal 28 or 30 is attached to provide a means for applying a dc voltage. The magnitude of the voltage should be such as to provide an electric field in the range of about 3 to 7 KV per centimeter of distance between ohmic strips 24 and 26. Because of the size of the devices as discussed herein, a voltage supply of up to 500 *dc* is satisfactory.

As an optional feature, it may be desirable in some applications to use a coating or layer 32 of a high permittivity material over the resistive layer 14 in the space between the input and output transducers. Suitable materials include barium titanate, strontium titanate and silicon dioxide. A thickness of dielectric layer 32 in excess of about 50 microns will not be seen by the electromagnetic energy having a frequency above a few GHz.

To avoid the damaging feedback problem experienced in $L < 100\ \mu$ amplifiers, the present invention contemplates the use of a larger separation on the order of 500 microns or more between the input and output transducers. This, with proper care, allows an output to input isolation on the order of 100 dB, an essential requirement for high electronic gain (30 –50 dB) amplifiers and a considerable improvement over the prior amplifiers which have only a 10–30 dB built-in isolation.

Figure 2:
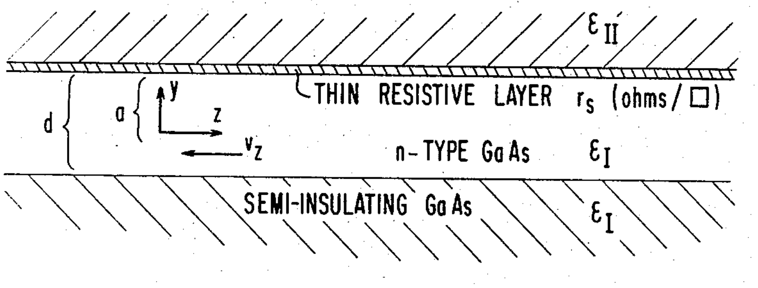
FIG. 2 is a diagrammatic cross section of the device of FIG. 1.

The reason for avoiding long, thin epitaxial layers 12 in the past has been the difficulty of obtaining uniform dc electric field biasing above the threshold value required for negative differential mobility that is needed for amplification. The present invention utilizes the idea of depositing a thin resistive layer 14 on the n-GaAs epitaxial layer as shown in FIG. 2. For the resistive layer sheet resistance $r_s$ less than the epitaxial layer resistance $r_n = 1/n_o e\ \mu_n d$, where $\mu_n$ is the magnitude of the negative mobility of the material for the dc biasing field, the sample is dc and low frequency stable. If the preceding condition is satisfied, the epitaxial layer can be biased with any uniform dc field in the negative differential mobility region of the material.

Figure 4:
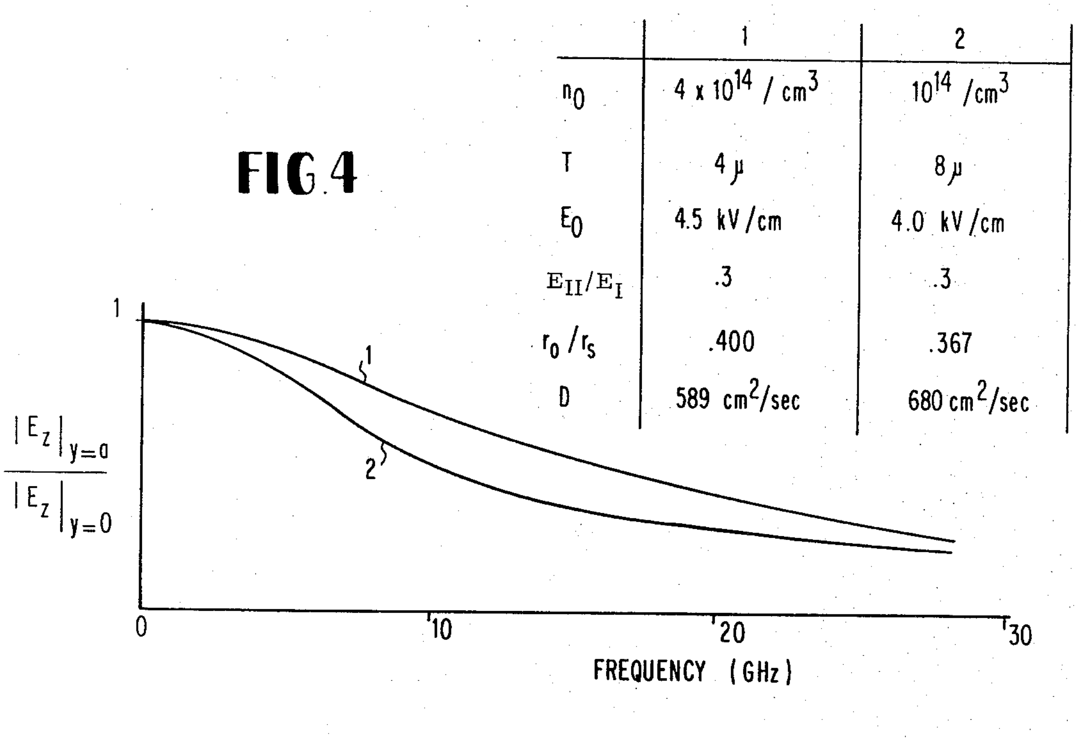
FIG. 4 is a plot of the field strength at the resistive layer.
Figure 3:
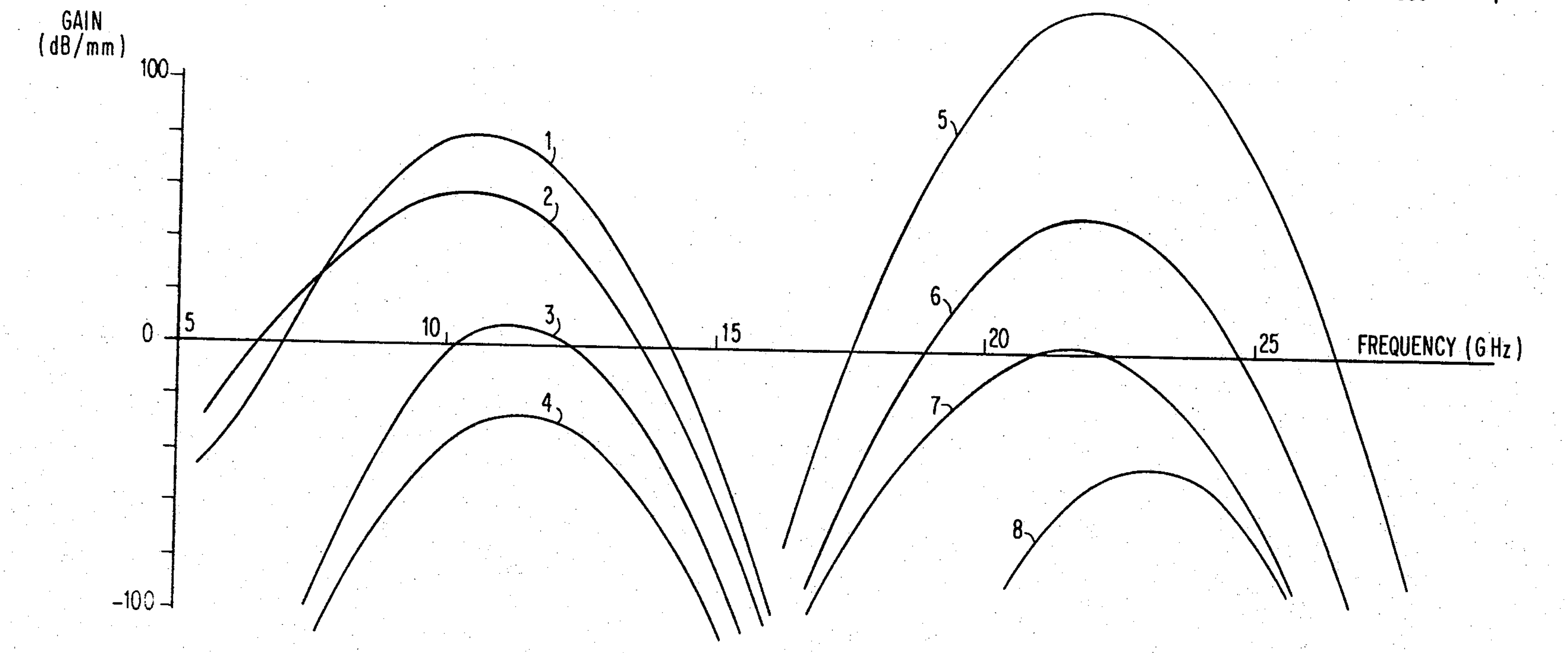
FIG. 3 is a plot of the RF gain for a device having the geometry of FIG. 2.

It is natural to want to determine the effect of this fairly low (~3k ohms/☐) resistive layer on the microwave propagation to ascertain that amplification is indeed possible at high frequencies. Following a procedure similar to that previously used, an RF wave potential $\phi_I$ of the form A cos $\alpha y\, e^{j(\omega t - \beta z)}$ is assumed for the active region I, and $\phi_{II}$ of the form B $e^{-\beta y} e^{j(\omega t - \beta z)}$ is assumed for region II (See FIG. 2). Including the carrier diffusion effects and matching the boundary conditions through the resistive layer, the dispersion equations of wave propagation are derived as $$\alpha^2\ \beta_{cy} + j\ (\beta_e - \beta) + (\beta^2 + \alpha^2)\ D/v_0 + \beta^2\ \beta_{cz} + j\ (\beta_e - \beta) + (\beta^2 + \alpha^2)\ D/v_0 = 0 \qquad (1)$$

$$\alpha \tan \alpha(d-a) = j\beta(\beta_e - \beta) + D/v_o\, \beta_2/j(\beta_e - \beta) + \beta_{cy} + \beta^2 D/v_o + D/v_o(\alpha^2 + \beta^2) \qquad (2)$$

and $$\alpha \tan \alpha a = \beta/\epsilon_I\ \ \beta/r_s v_o + j\, \epsilon_{II}\, \beta_e\ \ /j\beta_e + \beta_{cv} + (\alpha^2 + \beta^2)\ D/v_o \qquad (3)$$

where $$\beta_{cy} = e\ n_o\mu_y/\epsilon_I\ v_o,\ \beta_{cz} = e\ n_o\ \ \mu_z\ /\epsilon_I\ v_o,\ \beta_e = \omega/v_o$$

and D is the isotropic diffusion constant which is a function of the bias field. The transverse constant $\alpha$, the propagation constant $\beta$, and the dimension a, giving the location of the $y = 0$ or the maximum field plane in the epilayer, are determined by the computer solution of the simultaneous equations (1) to (3). The imaginary parts of $\beta$, calculated for some typical values of the parameters, are plotted in FIG. 3. By looking at the curves for the imaginary part $\beta_i$ of $\beta$, which is the growth constant for the waves, the following conclusions may be drawn:

1. The resistive layer used primarily for the purpose of allowing a uniform dc bias of the epilayer has a desirable side effect of making the differential conductivity of the device positive for lower frequencies, which therefore curtails the amplifications at the unwanted frequencies. This should contribute to the stability of the amplifier thus fabricated.
2. At microwave frequencies, the fields are attenuated to a smaller extent because the fields are the strongest at $y = 0$ and are fairly weak at the resistive layer $y = a$. A plot of the ratio of RF field strength at the resistive layer to its maximum value in the epilayer is plotted in FIG. 4 and substantiates this observation. The desired electronic amplification of 60–80 dB/mm ($B_i \approx 8$/mm) is still possible but is now obtained with somewhat thicker epilayers than would have been required without resistive layers.
3. The fact that slightly thicker epilayers, now on the order of 5 –10 microns, are required in the present device is an advantage in that epilayers of better electrical properties can now be grown than the prior art amplifiers using rather thin layers of 1–2 micron thickness. This should contribute to a superior performance of the device proposed here.
4. At still higher frequencies, the growth of the waves is curtailed because of the deleterious diffusion effects. This helps to limit the amplification band of the device, which once again should be advantageous in improving the stability and noise characteristics of the amplifier as compared to the previous device designs in which the active medium was capable of amplification from essentially dc frequencies to 300–500 GHz band. Despite the limitation on the band of amplification, the device is still fairly broad band. From FIG. 3 it is apparent that sufficiently wide band microwave amplification is indeed possible with the device proposed here.
5. Adequate electronic gains on the order of 60–80 dB/mm can be obtained by using epilayers of doping density and thickness well within the state-of-the-art of the present-day technology. This should be compared with the electronic gain in a prior art amplifier of approximately 675 dB/mm (45 dB internal gain in a drift length of 66 $\mu$). A considerably reduced growth rate, together with a superior output to input isolation of about 100 dB, thus results in a more uniform gain of the device than the undulatory gain versus frequency behavior of the prior amplifier.
6. In the disclosed device, the RF growth rate is deliberately moderated over and above what is obtained from the presence of the resistive layer. This may be done by using a slab or thick coating of a high permittivity material such as $BaTiO_3$ to cover the resistive layer. This helps to reduce the RF growth constant while not contributing to a drain on the dc current over and above what the maximum allowable $r_s$ consistent with the dc biasing requirement would cause.

7. As mentioned previously, with the resistive coating the epilayer can be biased for any uniform dc field in the negative differential mobility region. This provides a convenient method of electronic gain control of the device. This can be seen from the graphs plotted in FIG. 3.

In summary, the present invention contemplates use of relatively long (on the order of 0.5–1 mm) thin epitaxial layers 12 to provide stable traveling microwave amplification. As discussed above, with special care it should be possible to obtain an output to input isolation on the order of 100 dB, and thus alleviate the serious problem of undulatory gain versus frequency characteristics of the previously studied GaAs traveling-wave amplifiers. Broad band interdigital transducers at terminals 16 and 17 will be used to couple the power into the amplifying medium and a similar transducer used to couple power out of the device, thereby improving the 30 to 50 dB overall coupling (reflection) loss encountered with the couplers used in the previous devices.

The difficulty of uniform dc biasing of the long epilayer is resolved by the resistive layer 14 of sheet resistance less than the negative resistance of the epilayer. This helps too in suppressing the low frequency instability of the device. In the proposed device, broad band amplification would only be possible in the desired microwave band. From the numbers on the doping density and thickness of the epilayers required for microwave amplification, it can be seen that the characteristics of the material required are well within the current state-of-the-art.

In the fabrication of the device, the thin resistive layer is obtained by "spoiling" the skin of the epilayer as by ion implantation. Using this technique, various resistive layers of variable resistivity profiles may be provided to optimize the device performance. With the resistive coating, the epilayer 12 can be biased for any uniform dc field in the negative differential mobility region. This allows a convenient method of electronic gain control of the device.

Because of the restricted though fairly broad amplification band of the device of the present invention, it is felt that the noise performance of this amplifier is superior to the previous devices in which the active medium allowed amplification from essentially dc frequencies to 300 to 500 GHz band as is the case where the semiconductor material is GaAs.

An exact solution to the two-dimensional dc biasing problem can be carried out to calculate the field variation throughout the epilayer 12 using the prescribed resistive layer 14 characteristics. Starting from an assumed charge density, the electric field is calculated using the appropriate Green's function. This is then used in the integral form of the current continuity equation to find the time rate of change for the charge density distribution. The procedure is iterated in time to a steady-state solution. By using this approach, it is possible to determine the resistance layer profile to obtain a required electric field distribution.

The device disclosed herein can be fabricated using the integrated circuit techniques. This amplifier accordingly is believed to be a tremendous advance in the present state-of-the-art of microwave active devices. The fact that slightly thicker epilayers, at least 5 microns or more, are utilized gives better electrical properties and contributes to superior performance of the amplifier. At higher frequencies, the resistive layer curtails the growth of waves because of deleterious diffusion effects. This helps to limit the amplification band of the device which is advantageous in improving the stability and noise characteristics of the amplifier.

The present invention may be embodied in other specific forms without departing from the spirit or essential characteristics thereof. The presently disclosed embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A traveling electromagnetic wave amplifying device comprising a substrate composed of a semiconductor having an epitaxial thin film layer on one side thereof that is capable of exhibiting the property of negative differential conductivity;

input and output terminals including an input transducer and an output transducer on the epitaxial layer and spaced apart at least about 500 microns in the direction of wave propagation;

means including a resistive layer on the side of the epitaxial thin film layer opposite the substrate between the input and output transducers and ohmic terminals for said resistive layer for connection to a dc voltage source which supplies an electric field.

2. The device of claim 1 further comprising ohmic strips on the resistive layer outside the space between the transducers, and terminals connected to said ohmic strips for applying a variable dc voltage to produce an electric field up to about 7 KV per centimeter of distance between the ohmic strips to provide electronic gain control.

3. The device of claim 2 wherein the resistive layer has a sheet resistance less than the negative resistance of the epitaxial layer.

4. The device of claim 3 further having a layer of high permittivity material having a thickness of about 50 microns and extending over the surface of the resistive layer between the input and output transducers.

5. The device of claim 4 wherein the semiconductor material is gallium arsenide.

6. The device of claim 1 further having a layer of high dielectric material having a thickness of at least about 50 microns and extending over the surface of the resistive layer between the input and output transducers.

7. The device of claim 1 wherein the semiconductor material is selected from the group consisting of gallium arsenide, gallium phosphide, indium arsenide and indium phosphide.

8. A method for amplifying a band of electromagnetic waves comprising:

providing a substrate of semiconductor material;

forming an epitaxial layer having a thickness of at least three microns that is capable of exhibiting the property of negative differential conductivity;

forming a resistive layer on the side of the epitaxial film layer opposite the substrate to suppress low frequency instability of the device;

applying input and output terminals including input and output transducers on the surface containing the epitaxial layer with the transducers being spaced apart in the direction of wave propagation;

applying ohmic terminals outside of the space between the transducers;

feeding electromagnetic waves having a frequency up to about 500 GHz to the input terminal; and applying a dc voltage between said ohmic terminals.

9. The method of claim 8 wherein the resistive layer is formed by modifying the surface of the epitaxial layer to form a resistive layer having a sheet resistance less than the negative resistance of the epitaxial layer.

10. The method of claim 8 wherein said resistive layer is formed by ion implantation of the epitaxial layer.

11. The method of claim 8 wherein the gain of the amplifier is controlled by varying the magnitude of the dc voltage applied between said ohmic terminals.

* * * * *